United States Patent [19]
Sato

[11] Patent Number: 5,721,504
[45] Date of Patent: Feb. 24, 1998

[54] CLAMPING SEMICONDUCTOR CIRCUIT

[75] Inventor: Fumiki Sato, Itami, Japan

[73] Assignee: Mitsubishi Denki Kabushiki Kaisha, Tokyo, Japan

[21] Appl. No.: 538,944

[22] Filed: Oct. 4, 1995

[30] Foreign Application Priority Data

Apr. 21, 1995 [JP] Japan ................................. 7-097086

[51] Int. Cl.$^6$ ............................................. H03K 5/08
[52] U.S. Cl. ................................. 327/309; 327/328
[58] Field of Search ...................... 327/66, 68, 72, 327/77, 78, 79, 80, 81, 309, 310, 318, 321, 322, 327, 328, 389, 391, 427, 538, 543; 323/315

[56] References Cited

U.S. PATENT DOCUMENTS

| | | | |
|---|---|---|---|
| 3,925,718 | 12/1975 | Wittlinger | 323/4 |
| 4,004,164 | 1/1977 | Cranford, Jr. et al. | 327/543 |
| 4,061,928 | 12/1977 | Kessler | 327/310 |
| 4,092,612 | 5/1978 | Schade, Jr. | 330/288 |
| 4,268,789 | 5/1981 | Nagano | 323/315 |
| 4,495,425 | 1/1985 | McKenzie | 327/541 |
| 4,612,497 | 9/1986 | Ulmer | 327/328 |
| 5,099,156 | 3/1992 | Delbrück et al. | 327/63 |
| 5,148,065 | 9/1992 | Krenik et al. | 327/382 |
| 5,160,856 | 11/1992 | Yamaguchi et al. | 327/541 |
| 5,204,612 | 4/1993 | Lingstaedt | 323/315 |
| 5,283,484 | 2/1994 | Brehmer et al. | 327/309 |
| 5,420,499 | 5/1995 | DeShazo | 327/322 |
| 5,525,917 | 6/1996 | Wong et al. | 327/328 |

FOREIGN PATENT DOCUMENTS

| | | | |
|---|---|---|---|
| 53-39956 | 10/1979 | Japan | 327/327 |
| 1-165211 | 6/1989 | Japan . | |

*Primary Examiner*—Timothy P. Callahan
*Assistant Examiner*—My-Trang Nu Ton
*Attorney, Agent, or Firm*—Lowe, Price, LeBlanc & Becker

[57] ABSTRACT

The invention provides a clamping semiconductor circuit in which a first transistor of one conductivity type and a second transistor of another conductivity type are connected in series to each other and interposed between a power supply terminal and a signal line. The second transistor is supplied with a predetermined voltage, thereby allowing a current to flow from a power supply to the signal line. When the voltage of the signal line becomes equal to the predetermined voltage, all the transistors become nonconductive, thereby cutting off an unwanted current flowing from a power supply into the signal line.

14 Claims, 7 Drawing Sheets

CLAMPING SEMICONDUCTOR CIRCUIT

BACKGROUND OF THE INVENTION

1. Field of the Invention

The present invention relates to a clamping semiconductor circuit.

2. Description of Related Art

Figure 1:
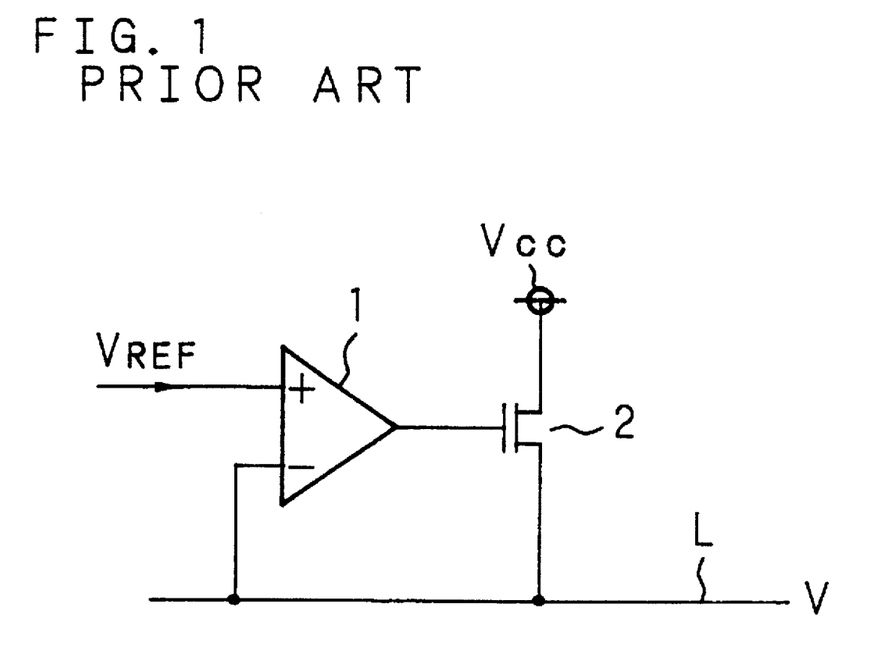
FIG. 1 is a block diagram showing the configuration of a conventional clamping circuit.

A clamping circuit is used to hold a voltage of a signal line at a predetermined level. FIG. 1 is a block diagram of such a clanging circuit using a differential amplifier. A differential amplifier 1 receives a reference voltage $V_{REF}$ at the positive input terminal+thereof, and is connected to a signal line L whose voltage is held at a predetermined level at the negative input terminal−thereof. The output voltage of the differential amplifier 1 is inputted to the gate of an N-channel field effect transistor (hereinafter referred to as the N-channel transistor) 2 interposed between a power supply $V_{CC}$ and the signal line L.

This clamping circuit is operated as follows: It is assumed that the differential amplifier 1 is an ideal differential amplifier having extremely large gain. In the case where the voltage V of the signal line L is lower than the reference voltage $V_{REF}$, the differential amplifier 1 outputs a voltage approximate to the voltage of the power supply $V_{CC}$ because the voltage supplied to the negative input terminal−of the differential amplifier 1 is lower than the voltage supplied to the positive input terminal+thereof. The output voltage is inputted to the gate of the N-channel transistor 2, thereby making the N-channel transistor 2 conductive. This results in a current flowing from the power supply $V_{CC}$ to the signal line L through the N-channel transistor 2, so that the signal line L is charged with the voltage. When the voltage of the signal line L is increased, the output voltage of the differential amplifier 1 is decreased because a difference between the voltage at the negative input terminal+of the differential amplifier 1 and that at the positive input terminal+thereof becomes smaller.

When the output voltage of the differential amplifier 1 exceeds a sum of the voltage V of the signal line L and a threshold voltage $V_{th}$ of the N-channel transistor 2, the N-channel transistor 2 becomes conductive. Since the gain of the differential amplifier 1 is extremely large, a difference between the input voltage at the negative input terminal−and that at the positive input terminal+at this point is extremely small. Accordingly, the voltage V of the signal line L clamped at the time of the N-channel transistor 2 being nonconductive is substantially equal to the reference voltage $V_{REF}$.

When the voltage V of the signal line L is higher than the reference voltage $V_{REF}$, the output voltage of the differential amplifier 1 is lower than the sun of the voltage V of the signal line L and the threshold voltage $V_{th}$, and the N-channel transistor 2 becomes nonconductive.

Figure 2:
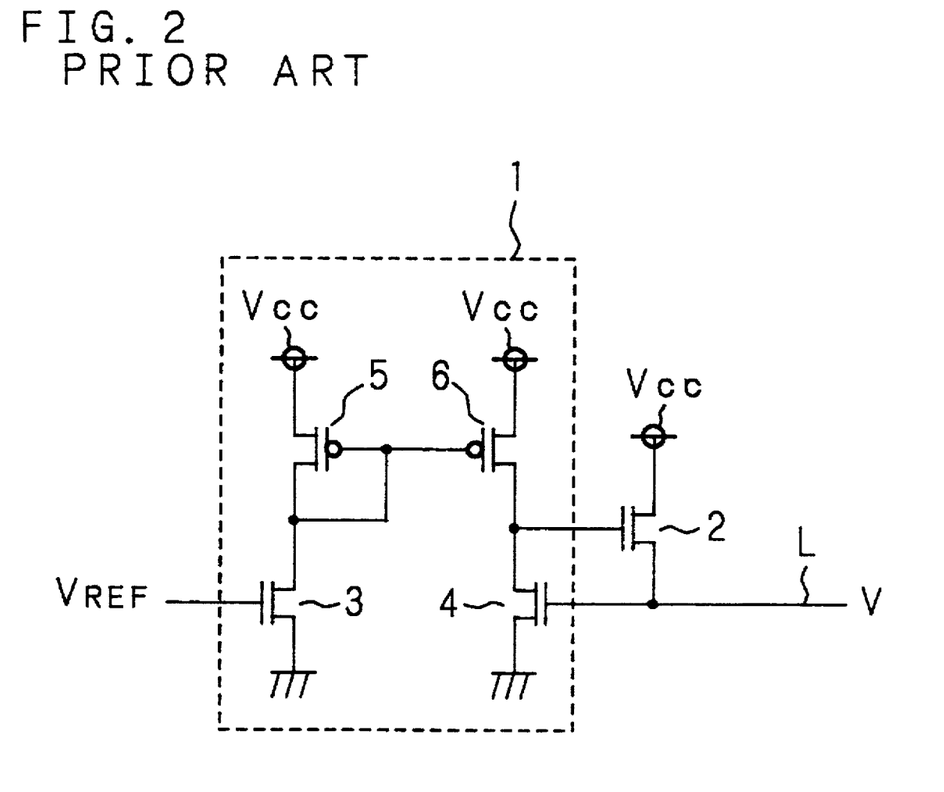
FIG. 2 is a block diagram showing the configuration of a differential amplifier of FIG. 1.

FIG. 2 is a block diagram of a clamping circuit in which the differential amplifier 1 of FIG. 1 is constructed with N-channel transistors and P-channel field effect transistors (hereinafter referred to as the P-channel transistors). The differential amplifier 1 comprises a P-channel transistor 5, a P-channel transistor 6, an N-channel transistor 3 and an N-channel transistor 4. The sources of the P-channel transistors 5 and 6 are connected to the power supply $V_{CC}$, and the drains thereof are connected to the drains of the N-channel transistors 3 and 4, respectively. The sources of the N-channel transistors 3 and 4 are grounded. The gates of the P-channel transistors 5 and 6 are connected to each other, and a node therebetween is connected to a node between the drains of the P-channel transistor 5 and the N-channel transistor 3. The gate of the N-channel transistor 3 is supplied with the reference voltage $V_{REF}$.

A node between the drains of the P-channel transistor 6 and the N-channel transistor 4 is connected to the gate of the N-channel transistor 2. The gate of the N-channel transistor 4 is connected to the signal line L. The drain of the N-channel transistor 2 is connected to the power supply $V_{CC}$, and the source thereof is connected to the gate of the N-channel transistor 4 and the signal line L. The differential amplifier 1 thus constructed has large gain when both the N-channel transistor 4 and the P-channel transistor 6 are operated in a saturation state, and a current always flows therethrough during the operation. Such a clamping circuit requires a large number of circuitry and is complicated because the differential amplifier is used. In addition, the clamping circuit has another problem of large power consumption because a current keeps on flowing through the N-channel transistor 4 and the P-channel transistor 6 in the differential amplifier 1 even when the N-channel transistor 2 for supplying a current to the signal line L is nonconductive.

Japanese Patent Publication Laid-Open No. 1-165211 (1989) discloses an amplifier for overcoming this problem. This amplifier comprises a differential amplifying unit, a driver circuit for differentiating in accordance with the output of the differential amplifying unit, a switching element interposed between the differential amplifying unit and a power supply, and means for controlling current supply to the differential amplifying unit by turning on/off the switching element so as to clamp the input level of the driver circuit at a predetermined level in association with the on/off state of the switching element. When the switching element is off, no differential current is supplied from the power supply in this amplifier, and hence almost no power is consumed in the differential amplifying unit.

This amplifier, however, includes a large number of circuitry and has a complicated configuration because of the differential amplifying unit. Furthermore, an additional transistor for cutting off an unwanted current is required since even when a transistor in the driver circuit is nonconductive, a current flows through a transistor in the differential amplifying unit. This additional transistor further increases the number of the circuitry.

SUMMARY OF THE INVENTION

The present invention has been devised to overcome the aforementioned problems, and the objective is to provide a semiconductor circuit which can be constructed with a small number of circuitry and can avoid unwanted current flow.

The clamping semiconductor circuit of the invention comprises a signal line; a first transistor of one conductivity type and a second transistor of another conductivity type connected in series to each other and interposed between a power supply terminal and the signal line; a third transistor of the same conductivity type as the first transistor interposed between the power supply terminal and the signal line. The gates of the first and third transistors are connected to a node between the first transistor and the second transistor, and the gate of the second transistor is supplied with a predetermined voltage.

In one aspect of the clamping semiconductor circuit of the invention, the source of the first transistor is connected to the power supply terminal, and the drain and the gate thereof are connected to each other. The source of the second transistor is connected to the signal line, and the drain thereof is connected to the drain of the first transistor. The source of the third transistor is connected to the power supply terminal, the drain thereof is connected to the signal line and the gate thereof is connected to the gate of the first transistor and a node between the first transistor and the second transistor.

In one aspect of the invention, the first and third transistors are p-type transistors and the second transistor is an n-type transistor, or the first and third transistors are n-type transistors and the second transistor is an p-type transistor.

In another aspect of the invention, the power supply terminal is connected to a ground power supply.

Accordingly, when the voltage of the signal line becomes lower than a predetermined voltage, the first, second and third transistors respectively become conductive, thereby supplying a current from the power supply terminal to the signal line. When the voltage of the signal line becomes equal to the predetermined voltage, the first, second and third transistors respectively become nonconductive, thereby cutting off the current flowing into the signal line. Thus, no unwanted current flows when the signal line is clamped at the predetermined voltage.

Alternatively, the clamping semiconductor circuit of the invention further comprises a fourth transistor of the same conductivity type as the first transistor interposed between the power supply terminal and the second transistor and connected to a second power supply terminal at the gate thereof.

In one aspect of the invention, the source of the fourth transistor is connected to the power supply terminal, the drain thereof is connected to the drain of the second transistor, and the gate thereof is connected to the second power supply terminal.

Accordingly, in the case where the second transistor is nonconductive, even when the threshold voltages of the first and third transistors connected to each other at their gates are not equal to each other, the first and third transistors can be made nonconductive without fail, thereby preventing an unwanted current from flowing therethrough.

Alternatively, the clamping semiconductor circuit of the invention comprises a signal line; a first transistor of one conductivity type, a second transistor and a third transistor of another conductivity type connected in series to one another and interposed between a power supply terminal and the signal line; and a fourth transistor of the same conductivity type as the first transistor interposed between the power supply terminal and the signal line. The gates of the first and fourth transistors are connected to a node between the first transistor and the second transistor. The gate of the second transistor is supplied with a first predetermined voltage, and the gate of the third transistor is supplied with a second predetermined voltage.

In one aspect of the invention, the source of the first transistor is connected to the power supply terminal, and the drain and the gate thereof are connected to each other. The drain of the second transistor is connected to the drain of the first transistor. The source of the third transistor is connected to the signal line, and the drain thereof is connected to the source of the second transistor. The source of the fourth transistor is connected to the power supply terminal, the drain thereof is connected to the signal line, and the gate thereof is connected to the gate of the first transistor and a node between the first transistor and the second transistor.

Accordingly, when the voltage of the signal line becomes equal to a predetermined voltage, the first, second and third transistors become nonconductive owing to the supply of the second predetermined voltage, thereby cutting off a current flowing into the signal line. Furthermore, the second transistor becomes nonconductive owing to the supply of the first predetermined voltage, thereby completely cutting off a current flowing through the third transistor. Thus, an unwanted current is further avoided.

In still another aspect of the invention, the clawing semiconductor circuit of the invention further comprises a fifth transistor of the same conductivity type as the first transistor interposed between the power supply terminal and the second transistor and connected to a second power supply terminal at the gate thereof.

In still another aspect of the invention, the source of the fifth transistor is connected to the power supply terminal, the drain thereof is connected to the drain of the second transistor and the gate thereof is connected to the second power supply terminal.

Accordingly, in the case where the second transistor becomes nonconductive, even when the threshold voltages of the first and fourth transistors connected to each other at their gates are not equal to each other, the first and fourth transistors become nonconductive without fail, thereby preventing an unwanted current from flowing therethrough.

The above and further objects and features of the invention will more fully be apparent from the following detailed description with accompanying drawings.

DESCRIPTION OF THE PREFERRED EMBODIMENTS

The present invention will now be described in detail referring to the accompanying drawings illustrating the embodiments.

Figure 3:
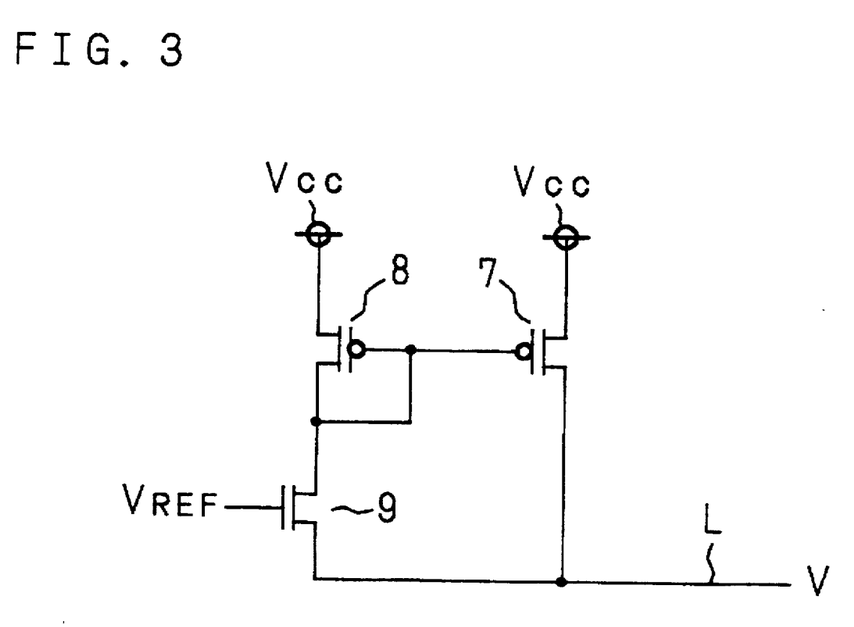
FIG. 3 is a block diagram showing the configuration of a clamping semiconductor circuit according to a first embodiment of the invention.

FIG. 3 is a block diagram showing the configuration of a clamping semiconductor circuit according to a first embodiment of the invention. The source of a first P-channel transistor 8 is connected to a power supply $V_{CC}$, and the drain thereof is connected to the drain of an N-channel transistor 9. A node between the drains of the P-channel transistor 8 and the N-channel transistor 9 is connected to the gate of the P-channel transistor 8 and the gate of a second P-channel transistor 7. The source of the P-channel transistor 7 is connected to another power supply $V_{CC}$. The source of the N-channel transistor 9 and the drain of the P-channel transistor 7 are connected to a signal line L. The gate of the N-channel transistor 9 is supplied with a reference voltage $V_{REF}$. A power supply terminal provided with the semiconductor circuit of this embodiment is connected to the power supply $V_{CC}$, which is shown in FIG. 3 instead of the power supply terminal.

This semiconductor circuit is operated as follows:

When the voltage V of the signal line L is lower than a voltage $VV_{REF}$ obtained by subtracting the threshold voltage $V_{th}$ of the N-channel transistor 9 from the reference voltage $V_{REF}$, the N-channel transistor 9 is conductive, thereby decreasing the voltage at the node between the drains of the P-channel transistor 8 and the N-channel transistor 9. As a result, both the P-channel transistors 7 and 8 become conductive. The P-channel transistor 8 is always in the saturation state when it is conductive. The P-channel transistor 7 is also in the saturation state at this point because the voltage at the node between the drains of the P-channel transistor 8 and the N-channel transistor 9 is higher than the voltage V of the signal line L. Therefore, a current flowing through the P-channel transistor 7 is determined by a current flowing through the P-channel transistor 8 (i.e., a current flowing through the N-channel transistor 9) and the size ratio between the P-channel transistors 7 and 8.

When the voltage V of the signal line L is equal to the voltage $V_{REF}$, the N-channel transistor 9 is nonconductive, and hence, the voltage at the node between the drains of the P-channel transistor 8 and the N-channel transistor 9 is increased until the P-channel transistor 8 becomes nonconductive. When the P-channel transistor 8 becomes nonconductive, the P-channel transistor 7 simultaneously becomes nonconductive.

When the voltage V of the signal line L is higher than the voltage $VV_{REF}$, the N-channel transistor 9 is nonconductive, and hence the P-channel transistor 7 is nonconductive.

In this manner, when the transistors are conductive, any current flowing through the semiconductor circuit flows into the signal line L so as to charge the signal line L. When the voltage of the signal line L is clamped and the signal line L is not charged, no current flows from the power supply $V_{CC}$ to the signal line L, resulting in preventing unwanted current consumption. Furthermore, disuse of a differential amplifier decreases the number of circuitry in this circuit.

Figure 4:
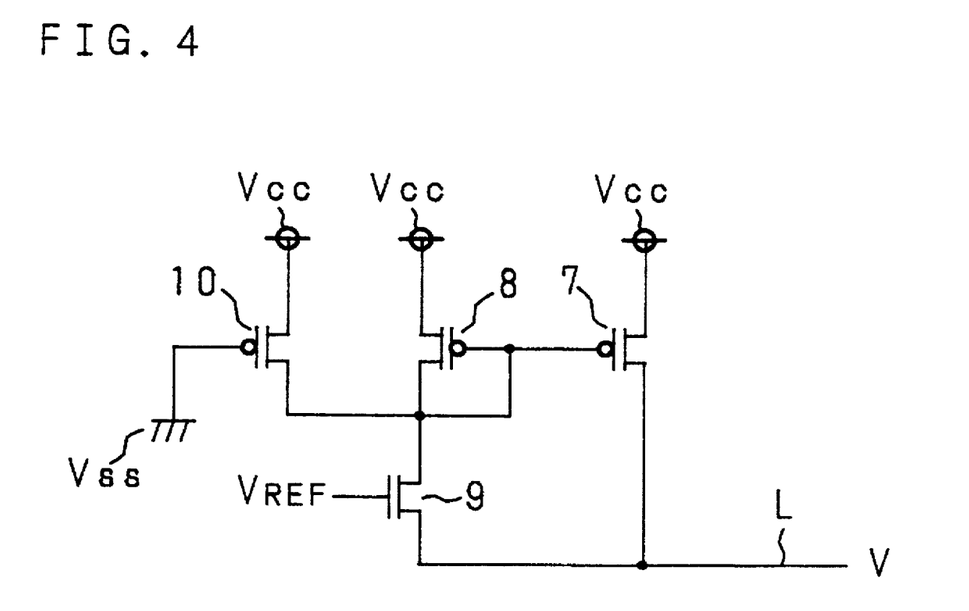
FIG. 4 is a block diagram showing the configuration of a clamping semiconductor circuit according to a second embodiment of the invention.

FIG. 4 is a block diagram showing the configuration of a clamping semiconductor circuit according to a second embodiment of the invention. The source of a third P-channel transistor 10 is connected to a power supply $V_{CC}$, and the drain thereof is connected to a node between the drains of a P-channel transistor 8 and an N-channel transistor 9. The gate of the P-channel transistor 10 is connected to a ground power supply $V_{SS}$. A current flowing through the P-channel transistor 10 is suppressed to be sufficiently small to be ignored as compared with a current flowing through the P-channel transistor 8 in charging the signal line L. The remaining configuration is identical to that shown in FIG. 3, and like reference numerals are used to refer to like elements. A power supply terminal provided with the semiconductor circuit of this embodiment is connected to the power supply $V_{CC}$, which is shown in FIG. 4 instead of the power supply terminal.

This semiconductor circuit is operated as follows:

The operation for clamping the voltage of the signal line L is performed in the same manner as described in the first embodiment shown in FIG. 3. In this semiconductor circuit, since the P-channel transistor 10 is always conductive, the voltage at the node between the drains of the P-channel transistor 8 and the N-channel transistor 9 approximates to the voltage of the power supply $V_{CC}$. Therefore, when the N-channel transistor 9 becomes nonconductive, the P-channel transistors 7 and 8 can be made nonconductive without fail by supplying the gate of the P-channel transistor 7 with a voltage as high as the voltage of the power supply $V_{CC}$, even when the threshold voltage $V_{th}$ of the P-channel transistor 7 is not equal to that of the P-channel transistor 8. In this manner, an unwanted current can be definitely cut off when the voltage V of the signal line L is clamped.

Figure 5:
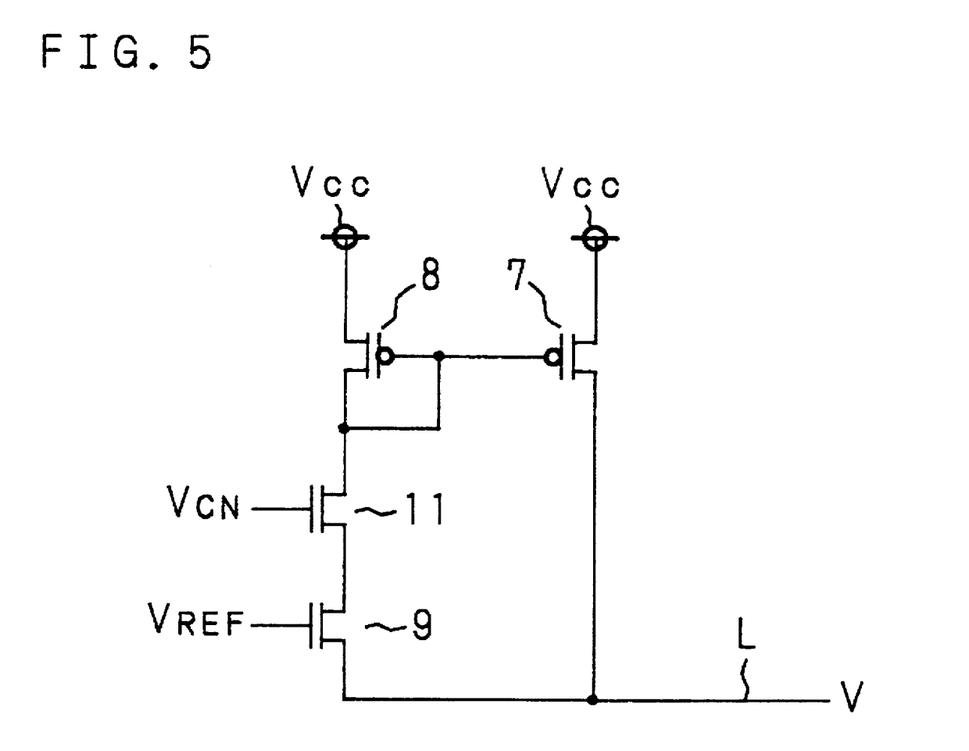
FIG. 5 is a block diagram showing the configuration of a clamping semiconductor circuit according to a third embodiment of the invention.

FIG. 5 is a block diagram of a clamping semiconductor circuit according to a third embodiment of the invention. An N-channel transistor 11 is interposed between a P-channel transistor 8 and an N-channel transistor 9. The drain of the N-channel transistor 11 is connected to the drain of the P-channel transistor 8, and the source thereof is connected to the drain of the N-channel transistor 9. The gate of the N-channel transistor 11 is supplied with a control voltage $V_{CN}$. The remaining configuration is identical to that shown in FIG. 3, and like reference numerals are used to refer to like elements. A power supply terminal provided with the semiconductor circuit of this embodiment is connected to the power supply $V_{CC}$, which is shown in FIG. 5 instead of the power supply terminal.

This semiconductor circuit is operated as follows: The operation for clamping the voltage V of the signal line L is performed similarly to that described in the first embodiment shown in FIG. 3 when the N-channel transistor 11 is conductive in this embodiment. In this circuit, the N-channel transistor 11 is nonconductive when the control voltage $V_{CN}$ is equal to the ground voltage. Then, the voltage at the node between the P-channel transistor 8 and the N-channel transistor 11 is increased to make the P-channel transistor 7 nonconductive, thereby completely cutting off a current flowing from the power supply $V_{CC}$ to the signal line L. Thus, an unwanted current is prevented from flowing from the power supply $V_{CC}$ when the voltage V of the signal line L is clamped.

Figure 6:
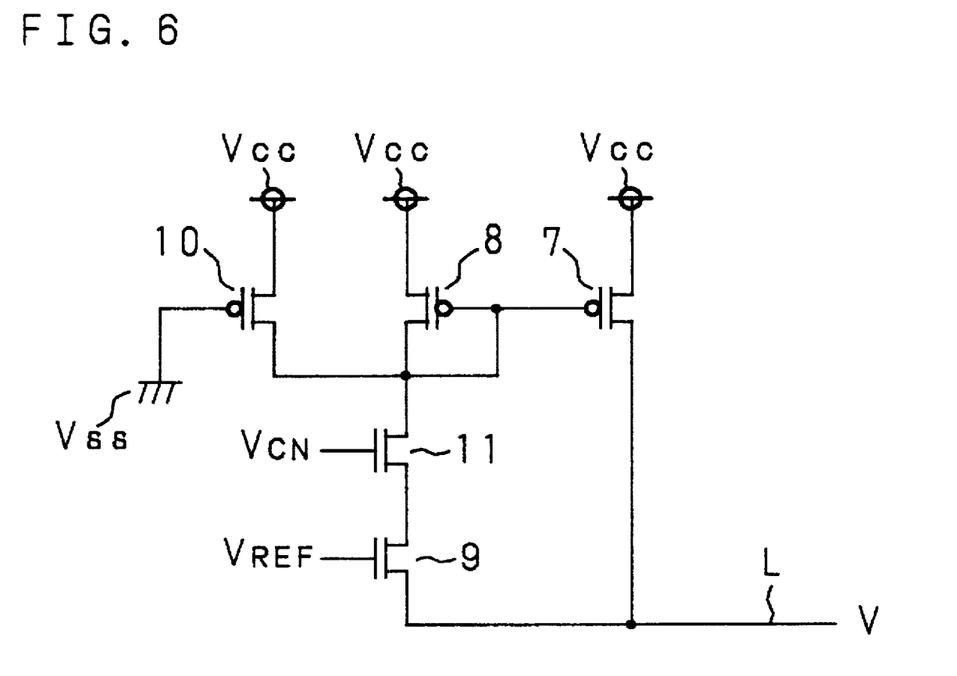
FIG. 6 is a block diagram showing the configuration of a clamping semiconductor circuit according to a fourth embodiment of the invention.

FIG. 6 is a block diagram of a semiconductor circuit according to a fourth embodiment of the invention. A P-channel transistor 10 is interposed between a power supply $V_{CC}$ and a node between a P-channel transistor 8 and an N-channel transistor 11. The gate of the P-channel transistor 10 is connected to a ground power supply $V_{SS}$. The remaining configuration is identical to that shown in FIG. 5, and like reference numerals are used to refer to like elements. A power supply terminal provided with the semiconductor circuit of this embodiment is connected to the power supply $V_{CC}$, which is shown in FIG. 6 instead of the power supply terminal.

This semiconductor circuit is operated as follows: The operation for clamping the voltage V of the signal line L is performed in the same manner as described in the third embodiment shown in FIG. 5. In this semiconductor circuit, the P-channel transistor 10 is always conductive, and the voltage at the node between the P-channel transistors 10 and 8 and the N-channel transistor 11 approximates to the voltage of the power supply $V_{CC}$. The N-channel transistor 11 is nonconductive when the control voltage $V_{CN}$ is equal to the ground voltage. Then, the voltage at the node between the P-channel transistors 8 and 10 and the N-channel transistor 11 is increased to make the P-channel transistor 7 nonconductive, resulting in completely cutting off a current flowing from the power supply $V_{CC}$ to the signal line L. In this manner, no unwanted current flows from the power supply $V_{CC}$ when the voltage V of the signal line L is clamped. Furthermore, similarly to the second embodiment shown in FIG. 4, the P-channel transistors 7 and 8 can be made nonconductive without fail even when the threshold voltages of the P-channel transistors 7 and 8 are not equal to each other.

Figure 7:
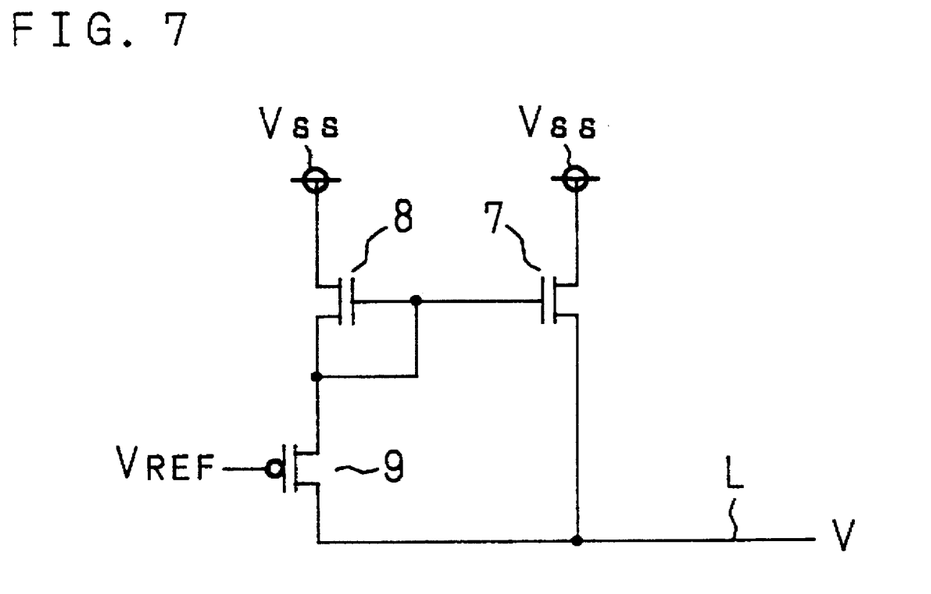
FIG. 7 is a block diagram showing the configuration of a clamping semiconductor circuit formed by changing the conductivity types of the transistors of the first embodiment.

It goes without saying that the same effect can be attained by replacing a P-channel transistor with an N-channel transistor, an N-channel transistor with a P-channel transistor, a power supply with a ground power supply and a ground power supply with a power supply. FIG. 7 is a block diagram of the configuration of a semiconductor circuit obtained by modifying the conductivity types of the transistors of the first embodiment. A power supply terminal provided with the semiconductor circuit of FIG. 7 is connected to the ground power supply $V_{SS}$, which is shown in FIG. 7 instead of the power supply terminal.

As described above, the present clamping semiconductor circuit can be constructed with a smaller number of circuitry without using a differential amplifier. Furthermore, when a signal line is not charged with a voltage, an unwanted current is prevented from being consumed. In addition, even when the threshold voltages of transistors whose gates are connected to each other are not equal to each other, both the transistors can be made nonconductive when the signal line is not charged with a voltage, so as to prevent an unwanted current from being consumed.

As this invention may be embodied in several forms without departing from the spirit of essential characteristics thereof, the present embodiment is therefore illustrative and not restrictive, since the scope of the invention is defined by the appended claims rather than by the description preceding them, and all changes that fall within metes and bounds of the claims, or equivalence of such metes and bounds thereof are therefore intended to be embraced by the claims.

What is claimed is:

1. A clamping semiconductor circuit for keeping a signal line at a predetermined voltage, comprising:

a signal line;

a first transistor of one conductivity type and a second transistor of another conductivity type connected in series to each other directly between a power supply terminal and the signal line; and a third transistor of the same conductivity type as the first transistor having a first source/drain region connected to the power supply terminal, a second source/drain region connected directly to the signal line, and a gate, wherein the gates of the first and third transistors are connected to a node between the first transistor and the second transistor, and the gate of the second transistor is supplied with a predetermined voltage.

2. The clamping semiconductor circuit according to claim 1, further comprising a fourth transistor of the same conductivity type as the first transistor connected between the power supply terminal and the second transistor, and connected to a second power supply terminal at a gate thereof.

3. The clamping semiconductor circuit according to claim 1, wherein the first and third transistors are p-type transistors and the second transistor is an n-type transistor.

4. The clamping semiconductor circuit according to claim 1, wherein the first and third transistors are n-type transistors and the second transistor is a p-type transistor.

5. The clamping semiconductor circuit according to claim 1, wherein the power supply terminal is connected to a ground power supply.

6. A clamping semiconductor circuit for keeping a signal line at a predetermined voltage, comprising:

a signal line;

a first transistor of one conductivity type whose source is connected to a power supply terminal and whose drain and gate are connected to each other;

a second transistor of another conductivity type whose source is directly connected to the signal line and whose drain is connected to the drain of the first transistor; and a third transistor of the same conductivity type as the first transistor whose source is connected to the power supply terminal, whose drain is directly connected to the signal line, and whose gate is connected to the gate of the first transistor and a node between the first transistor and the second transistor, wherein the gate of the second transistor is supplied with a predetermined voltage.

7. The clamping semiconductor circuit according to claim 6, further comprising a fourth transistor of the same conductivity type as the first transistor whose source is connected to the power supply terminal, whose drain is connected to the drain of the second transistor, and whose gate is connected to a second power supply terminal.

8. The clamping semiconductor circuit according to claim 6, wherein the first and third transistors are p-type transistors and the second transistor is an n-type transistor.

9. The clamping semiconductor circuit according to claim 6, wherein the first and third transistors are n-type transistors and the second transistor is a p-type transistor.

10. The clamping semiconductor circuit according to claim 8, wherein the power supply terminal is connected to a ground power supply.

11. A clamping semiconductor circuit for keeping a signal line at a predetermined voltage, comprising:

a signal line;

a first transistor of one conductivity type, a second transistor and a third transistor of another conductivity type connected in series to one another directly between a power supply terminal and the signal line; and a fourth transistor of the same conductivity type as the first transistor having a first source/drain region connected to the power supply terminal, a second source/drain region directly connected to the signal line, and a gate, wherein the gates of the first and fourth transistors are connected to a node between the first transistor and the second transistor, and the gate of the second transistor is supplied with a first predetermined voltage and the gate of the third transistor is supplied with a second predetermined voltage.

12. The clamping semiconductor circuit according to claim 11, further comprising a fifth transistor of the same conductivity type as the first transistor connected between the power supply terminal and the second transistor, and connected to a second power supply terminal at a gate thereof.

13. A clamping semiconductor circuit for keeping a signal line at a predetermined voltage, comprising:

a signal line;

a first transistor of one conductivity type whose source is connected to a power supply terminal and whose drain and gate are connected to each other;

a second transistor of another conductivity type whose drain is connected to the drain of the first transistor;

a third transistor of the same conductivity type as the second transistor whose source is directly connected to the signal line, and whose drain is connected to the source of the second transistor; and a fourth transistor of the same conductivity type as the first transistor whose source is connected to the power supply terminal, whose drain is directly connected to the signal line and whose gate is connected to the gate of the first transistor and a node between the first transistor and the second transistor, wherein the gate of the second transistor is supplied with a first predetermined voltage and the gate of the third transistor is supplied with a second predetermined voltage.

14. The clamping semiconductor circuit according to claim 13, further comprising a fifth transistor of the same conductivity type as the first transistor whose source is connected to the power supply terminal, whose drain is connected to the drain of the second transistor, and whose gate is connected to a second power supply terminal.

* * * * *